United States Patent [19]

Posse

[11] Patent Number: 5,237,221
[45] Date of Patent: Aug. 17, 1993

[54] ON-CHIP PULL-UP CIRCUIT WHICH MAY BE SELECTIVELY DISABLED

[75] Inventor: Kenneth E. Posse, Fort Collins, Colo.

[73] Assignee: Hewlett-Packard Company, Palo Alto, Calif.

[21] Appl. No.: 797,613

[22] Filed: Nov. 25, 1991

[51] Int. Cl.$^5$ ............................................ H03K 19/094
[52] U.S. Cl. .................................... 307/468; 307/475; 307/296.1
[58] Field of Search ............ 307/475, 468, 465, 296.1

[56] References Cited

U.S. PATENT DOCUMENTS

| | | | |
|---|---|---|---|
| 4,223,227 | 9/1980 | Taylor et al. | 307/469 |
| 4,481,432 | 11/1984 | Davies, Jr. | 307/469 |
| 4,567,575 | 1/1986 | Morihisia et al. | 307/475 |
| 4,833,349 | 5/1989 | Liu et al. | 307/468 |
| 4,843,262 | 6/1989 | Abe | 307/475 |

Primary Examiner—Edward P. Westin
Assistant Examiner—Jon Santamauro

[57] ABSTRACT

An on-chip pull-up which can be selectively enabled/disabled comprises a pull-up transistor (e.g., an FET) connected between the line to be pulled up/down and a bias voltage (e.g., a positive voltage $V_{DD}$ or a negative voltage $V_{SS}$). The control lead (e.g., gate lead) of the transistor is then made externally accessible. Connecting the control lead to $V_{DD}$ or $V_{SS}$ either enables or disables the pull-up depending on the particular transistor.

11 Claims, 2 Drawing Sheets

ON-CHIP PULL-UP CIRCUIT WHICH MAY BE SELECTIVELY DISABLED

FIELD OF THE INVENTION

This invention relates generally to the field of electronic circuit integration. More particularly, the invention relates to on-chip pull-up/pull-down circuits which are selectively enabled or disabled by a user from off of the chip.

BACKGROUND OF THE INVENTION

As technology in the electronics field advances, circuit densities are perpetually increasing. Discrete components have given way to integrated circuits (IC's) mounted on printed wiring boards. The IC includes a silicon die (chip) mounted in a package which protects and provides I/O (input/output) signal access to the chip. The medium scale integration (MSI) chip has been produced in a variety of different packages (e.g., dual-in-line packages, pin grid array, cerdip, etc.).

Further decreases in silicon die size and the resulting step up to large scale integration (LSI) and very large scale integration (VLSI) have led to the development of hybrid packages (i.e., bare silicon chips mounted on a common ceramic or silicon substrate), TAB (Tape Automated Bonding), ASIC's (Application Specific Integrated Circuits), and surface mount.

State of the art technologies are pushing integration well beyond VLSI. The resultant increase in operational clock speeds (e.g., approaching $10^9$Hz) has resulted in complex new packaging problems. This has led to development of multichip modules (MCM's). The MCM is a wafer-size integration hybrid which includes a plurality of silicon dies mounted on a common substrate. The same process which is used to form the interconnect system on the chip may be used to form the chip-to-chip interconnect on the substrate.

The MCM allows more chips to be brought closer together to accommodate greater I/O rates and greater signal processing speeds. This is accomplished by using fine line interconnection features fabricated through thin film microlithographic techniques.

Pull-up resistors make up a significant percentage of the analog devices on a circuit board. Therefore, it is highly desirable to include them directly on the chip itself in order to further reduce the circuit size. A pull-up resistor or simply a "pull-up" is a simple circuit (e.g., a resistor) which is used to provide a bias voltage to a wire (e.g., a bus) in a digital circuit. Conventionally, the term "pull-up" has referred to a circuit for providing a bias voltage which is equivalent to a logical HIGH (e.g., a positive voltage). The term "pull-down", on the other hand, has conventionally been used to identify a circuit for providing a bias voltage which is equivalent to a logical LOW (e.g., ground or a negative voltage). As used herein, the term "pull-up" is used generically to describe either a pull-up or pull-down circuit unless indicated otherwise.

The pull-up serves a variety of purposes. For example, it may be used to provide a logic HIGH capability to open-drain or open-collector type outputs, to provide higher current sourcing capabilities to totem-pole type outputs, to help control the effects of noise on a bus, and to provide a termination load on a bus (i.e., to provide damping to prevent high frequency ringing).

A pull-up is easily emulated on a chip using a transistor (e.g., an FET) rather than a resistor. It may be connected to an input terminal or an output terminal on the chip. For example, the pull-up may include an N-channel depletion-mode MOSFET with the gate and drain leads connected to the positive voltage supply $V_{DD}$ and the source lead connected to the I/O terminal to be pulled up. This configuration will cause the transistor to act like a constant current source and to provide $V_{DD}$ to the I/O terminal. Thus, the general term "pull-up" is not limited to only resistors, but includes any circuit which performs the pull-up function.

A major problem confronted when using on-chip pull-ups is that of inflexibility because a pull-up is not always needed. For example, IC's which are typically connected to a bus (and therefore require pull-ups) are not individually designed or manufactured. Thus, all IC's must either be produced with pull-ups or without. If pull-ups are used on every chip connected to a bus, then the current which a device has to sink in order to pull the bus LOW will be greatly increased and may exceed the limits of the sinking transistor. For example, if a bus has six output drivers connected to it and each driver includes an on-chip pull-up capable of sourcing a nominal 5 mA, then one of the six outputs attempting to pull the bus LOW must be able to sink 30 mA. This current may exceed the current handling capabilities of the sinking output such that it is not capable of pulling the bus LOW or such that the output is damaged from the excess current.

The alternative is to produce two types of each IC chip: one with pull-ups and one without. In this manner, only one of the six chips discussed in the example above could have an on-chip pull-up. This, however, is a cumbersome and expensive approach which is not likely to be commercially accepted.

What is needed is an on-chip pull-up which may be selectively enabled/disabled.

SUMMARY OF THE INVENTION

The invention is an on-chip pull-up which can be selectively enabled/disabled. A pull-up transistor (e.g., a MOSFET) is connected to the I/O terminal to be pulled HIGH. The control lead of this on-chip pull-up transistor is then made externally accessible so that the pull-up may be switched ON or OFF. The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
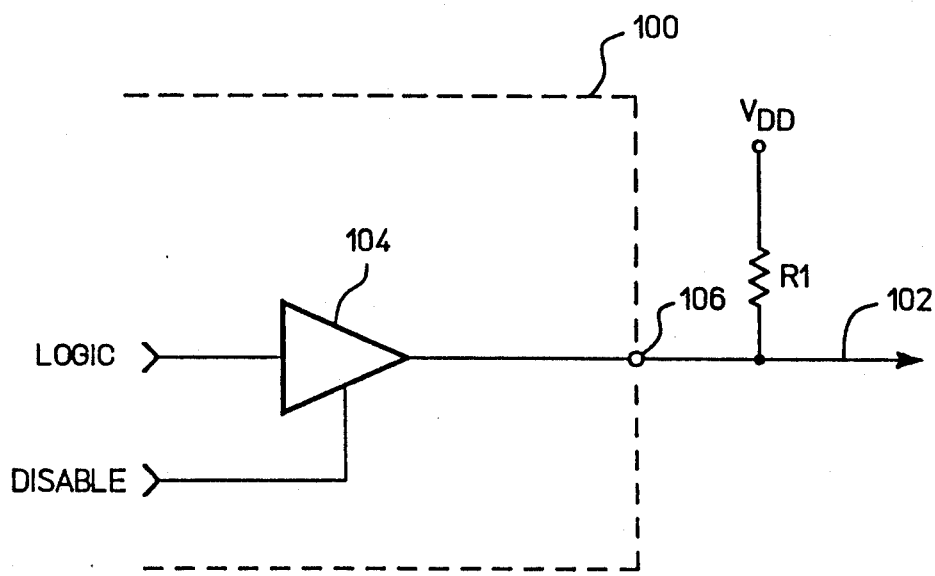
FIG. 1 is a schematic diagram of the conventional discreet pull-up resistor.
Figure 2:
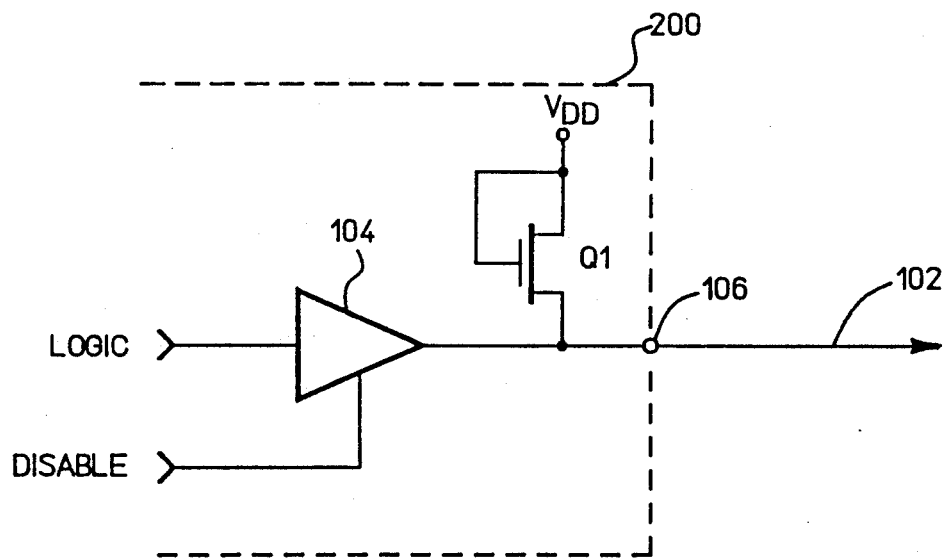
FIG. 2 is a schematic diagram of the conventional on-chip (silicon) implementation of a pull-up resistor.

The invention is now described with reference to the figures where like reference numbers are used to indicate like elements. Conventional pull-up circuits are shown in FIGS. 1 and 2. FIG. 1 depicts a conventional pull-up resistor R1 connected to a bus 102. An IC chip 100 having an output driver 104 has an output terminal

106. Output terminal 106 is driving bus 102. Output driver 104 is commonly a cascaded array of totem-pole type transistor drivers. Driver 104 is controlled by the internal logic of chip 100. Driver 104 may be a three-state device (i.e., may be disabled).

A logic supply voltage $V_{DD}$ is applied to bus 102 through resistor R1. $V_{DD}$ supplies a positive voltage with respect to $V_{SS}$ which is either a negative voltage or zero (i.e., ground). This drives bus 102 to a logical HIGH state. The maximum current which can be sourced by the pull-up is controlled by the value of resistor R1.

FIG. 2 shows an IC chip 200 having an on-chip pull-up. As with chip 100, an output driver 104 is shown driving output terminal 106. Bus 102 is connected to output terminal 106. Resistor R1 of FIG. 1 has been implemented on chip 200 using a transistor Q1. The source lead of transistor Q1 is tied to output terminal 106. Bus 102 is connected to output terminal 106. The gate and drain leads of transistor Q1 are tied to $V_{DD}$ such that Q1 acts like a constant current source. In this manner, the pull-up is implemented on the chip itself. As discussed above, however, this type of on-chip pull-up is inflexible and is therefore often not desirable.

Figure 3:
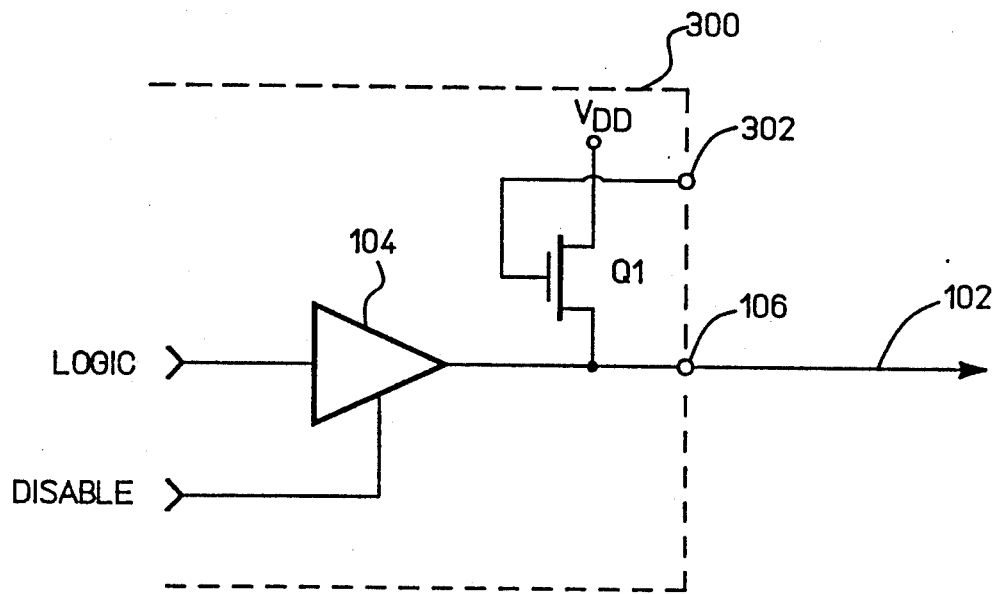
FIG. 3 is a schematic diagram of the on-chip pull-up of the invention.

The invention is now described with reference to FIGS. 3 and 4. FIG. 3 shows a partial block diagram of a chip 300 embodying the invention. As with chip 100, an output driver 104 is shown driving bus 102. Pull-up transistor Q1 is connected to output terminal 106 within the boundary of chip 300. The conductive channel (drain-source) of Q1 is connected between $V_{DD}$ and the output terminal. The gate lead (i.e., the control lead) of Q1 is made externally accessible via a control terminal 302. That is, the gate lead of Q1 is not connected to $V_{DD}$ as with the conventional on-chip pull-up but is routed off the chip. A user may now control transistor Q1 through control terminal 302 as discussed in the example below.

Figure 4:
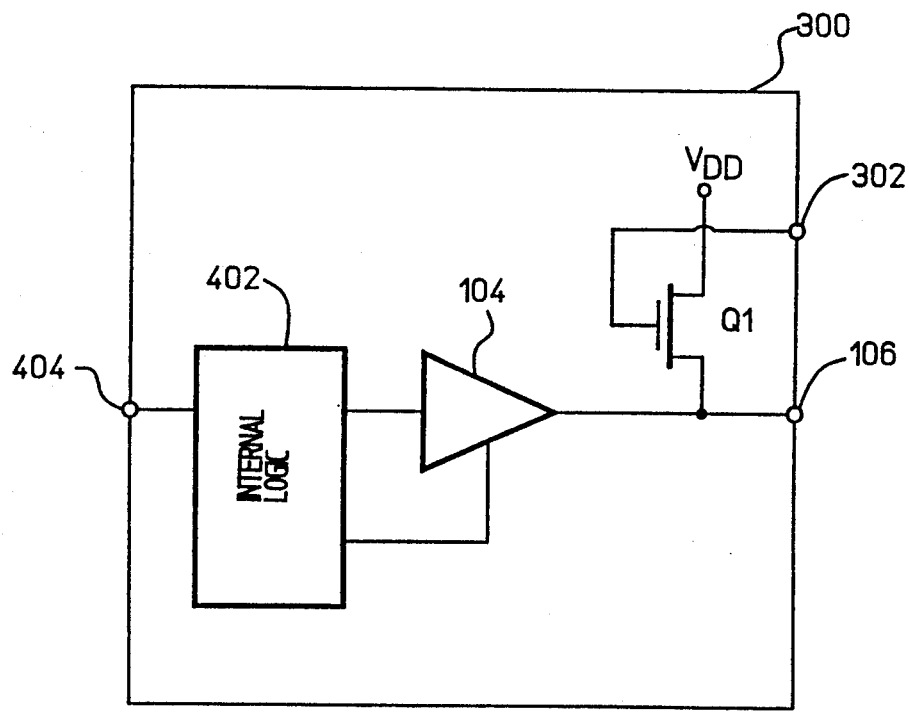
FIG. 4 is a schematic diagram of an integrated circuit chip embodying the invention.

FIG. 4 shows a complete block diagram of chip 300 further including an input terminal 404 and internal logic 402. Internal logic 402 controls output driver 104.

While not shown in the figures, a pull-down circuit would be implemented substantially identical to the pull-up circuit. However, the conductive channel of Q1 would be connected between $V_{SS}$ and bus 102. This allows the pull-down to connect the bus to $V_{SS}$ (rather than $V_{DD}$) such that the bus is biased normally LOW (rather than HIGH).

In a sample implementation of a pull-up according to the invention, Q1 is an N-channel depletion-mode MOSFET (Metal-Oxide-Semiconductor Field Effect Transistor) with the drain lead connected to $V_{DD}$ and the source lead connected to bus 102. Connecting $V_{DD}$ to terminal 302 will cause a conductive channel to form in Q1 such that the pull-up will be enabled. Connecting $V_{SS}$ (e.g., ground) to terminal 302 will disable the pull-up by causing Q1 to turn OFF such that $V_{DD}$ will not be supplied to bus 102 via the conductive channel of Q1.

Similarly, in a sample implementation of a pull-down according to the invention, Q1 is implemented with a P-channel depletion-mode MOSFET with the drain lead connected to $V_{SS}$ and the source lead connected to bus 102. Connecting $V_{SS}$ to terminal 302 will cause a conductive channel to form in Q1 such that the pull-down will be enabled. Connecting $V_{DD}$ to terminal 302 will disable the pull-up by causing Q1 to turn OFF such that $V_{SS}$ will not be supplied to bus 102 via the conductive channel of Q1.

These specific examples of the invention are provided for purposes of illustration only. One of skill in the art will recognize that other transistor technologies (e.g., JFET's, VFET's, enhancement-mode MOSFET's, and the like) may also be used to implement Q1. Further, the pull-up of the invention has been illustrated on an output terminal of an IC chip. It may be used, however, to pull up (or down) an input terminal of an IC chip as well.

The invention is particularly suited to use in the environment of MCM's, however, it has utility for any integrated circuit package.

While the invention has been particularly shown and described with reference to a preferred embodiment thereof, it will be understood by those skilled in the art that various changes in form and details may be made therein without departing from the spirit and scope of the invention.

I claim:

1. An on-chip pull-up circuit for selectively providing a bias voltage to an I/O terminal of an integrated circuit chip, said pull-up circuit comprising a transistor having a control lead and a conductive channel, said conductive channel being connected between a bias voltage source and the I/O terminal of the integrated circuit chip, said control lead being routed off the integrated circuit chip to provide a user direct access thereto.

2. The on-chip pull-up circuit of claim 1, wherein said transistor is a field effect transistor (FET), said conductive channel is formed between a source lead and a drain lead of said FET, and said control lead is the gate lead of said FET.

3. The on-chip pull-up circuit of claim 2, wherein said bias voltage source produces a positive voltage, and wherein said FET is an N-channel depletion-mode MOSFET having said drain lead connected to said bias voltage source and having said source lead connected to said I/O terminal.

4. The on-chip pull-up circuit of claim 2, wherein said bias voltage source produces a negative voltage, and wherein said FET is a P-channel depletion-mode MOSFET having said drain lead connected to said bias voltage source and having said source lead connected to said I/O terminal.

5. An integrated circuit chip comprising:
   a plurality of I/O terminals for communicating with the chip, said I/O terminals including an input terminal and an output terminal;
   internal logic for receiving an input signal from said input terminal and for generating an output signal in response thereto;
   an output driver means connected to said internal logic for amplifying said output signal and for supplying said output signal to said output terminal; and
   a pull-up means connected to one of said I/O terminals for providing a bias voltage thereto, said pull-up means having a control lead which is directly accessible from off of the chip for selectively enabling/disabling said pull-up means.

6. The integrated circuit chip of claim 5, wherein said pull-up means is a field effect transistor (FET) having a conductive channel formed between a source lead and a drain lead, and wherein said control lead is a gate lead of said FET.

7. The integrated circuit chip of claim 6, wherein said bias voltage is a positive voltage, and wherein said FET is an N-channel depletion-mode MOSFET having said drain lead connected to said bias voltage and having said source lead connected to said one of said I/O terminals.

8. The integrated circuit chip of claim 6, wherein said bias voltage is a negative voltage, and wherein said FET is a P-channel depletion-mode MOSFET having said drain lead connected to said bias voltage and having said source lead connected to said one of said I/O terminals.

9. An integrated circuit chip with an I/O terminal having a pull-up circuit connected thereto, said pull-up circuit formed integrally on said integrated circuit chip, said pull-up circuit comprising a field effect transistor having a drain-source channel controlled by a gate lead, said drain-source channel connecting a bias voltage source to the I/O terminal, said gate lead being routed off of the chip to provide a user direct access thereto.

10. The integrated circuit chip of claim 9, wherein said bias voltage source produces a positive voltage, and wherein said field effect transistor is an N-channel depletion-mode MOSFET having said drain lead connected to said bias voltage source and having said source lead connected to said I/O terminal.

11. The integrated circuit chip of claim 9, wherein said bias voltage source produces a negative voltage, and wherein said FET is a P-channel depletion-mode MOSFET having said drain lead connected to said bias voltage source and having said source lead connected to said I/O terminal.

* * * * *